United States Patent
Chen et al.

(10) Patent No.: US 8,525,200 B2
(45) Date of Patent: Sep. 3, 2013

(54) LIGHT-EMITTING DIODE WITH NON-METALLIC REFLECTOR

(75) Inventors: Ding-Yuan Chen, Taichung (TW);
Wen-Chih Chiou, Miaoli (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 12/269,497

(22) Filed: Nov. 12, 2008

(65) Prior Publication Data
US 2010/0038661 A1 Feb. 18, 2010

Related U.S. Application Data

(60) Provisional application No. 61/089,779, filed on Aug. 18, 2008.

(51) Int. Cl.
*H01L 33/00* (2010.01)
*H01L 21/00* (2006.01)

(52) U.S. Cl.
USPC ........... 257/98; 257/E33.01; 257/E33.058; 438/29

(58) Field of Classification Search
CPC ......... H01L 33/60; H01L 33/20; H01L 33/62; H01L 33/0079; H01L 27/1214
USPC ........... 257/98, 99, 79, E33.01, 13, E33.056, 257/E33.058; 438/29, 79, 98, 22, 46
See application file for complete search history.

(56) References Cited

U.S. PATENT DOCUMENTS

| 4,684,565 | A | * | 8/1987 | Abeles et al. ............ 428/220 |
| 5,478,658 | A | * | 12/1995 | Dodabalapur et al. ..... 428/690 |
| 6,139,760 | A | * | 10/2000 | Shim et al. ............... 216/24 |
| 6,222,868 | B1 | * | 4/2001 | Ouchi et al. ............ 372/50.1 |
| 6,696,308 | B1 | * | 2/2004 | Shieh et al. .............. 438/24 |
| 6,933,210 | B2 | | 8/2005 | Inoue |

(Continued)

FOREIGN PATENT DOCUMENTS

| CN | 1536616 A | 10/2004 |
| CN | 2694495 Y | 4/2005 |
| EP | 1 885 001 A1 | 2/2008 |
| WO | WO 2006/125396 A1 | 11/2006 |

OTHER PUBLICATIONS

"Thermal Conductivity Electrical Conductivity" at http://hyperphysics.phy-astr.gsu.edu/hbase/thermo/thercond.html, Dec. 12, 2011.*

(Continued)

*Primary Examiner* — Nikolay Yushin
(74) *Attorney, Agent, or Firm* — Haynes and Boone, LLP

(57) ABSTRACT

A light-emitting diode (LED) device is provided. The LED device has a substrate, a reflective structure over the substrate, and an LED structure over the reflective structure. The reflective structure is formed of non-metallic materials. In one embodiment, the reflective structure is formed of alternating layers of different non-metallic materials having different refractive indices. In another embodiment, the reflective structure is formed of alternating layers of high-porosity silicon and low-porosity silicon. In yet another embodiment, the reflective structure is formed of silicon dioxide, which may allow the use of fewer layers. The reflective structure may be formed directly on the same substrate as the LED structure or formed on a separate substrate and then bonded to the LED structure.

16 Claims, 8 Drawing Sheets

(56) References Cited

U.S. PATENT DOCUMENTS

| | | | |
|---|---|---|---|
| 7,326,967 B2 | 2/2008 | Hsieh et al. | |
| 2002/0094004 A1* | 7/2002 | Furukawa | 372/46 |
| 2003/0170280 A1* | 9/2003 | Canham et al. | 424/401 |
| 2004/0095661 A1* | 5/2004 | Chidichimo et al. | 359/883 |
| 2004/0104398 A1* | 6/2004 | Hon et al. | 257/98 |
| 2005/0018300 A1* | 1/2005 | Weiss et al. | 359/580 |
| 2005/0051861 A1* | 3/2005 | Shi et al. | 257/438 |
| 2005/0100069 A1* | 5/2005 | Gwo | 372/50 |
| 2005/0152146 A1* | 7/2005 | Owen et al. | 362/294 |
| 2005/0274988 A1* | 12/2005 | Hong | 257/225 |
| 2006/0255341 A1* | 11/2006 | Pinnington et al. | 257/79 |
| 2006/0285566 A1* | 12/2006 | Ueki | 372/45.01 |
| 2007/0285566 A1* | 12/2007 | Lee | 348/465 |
| 2008/0157115 A1* | 7/2008 | Chuang et al. | 257/99 |
| 2008/0173884 A1* | 7/2008 | Chitnis et al. | 257/98 |
| 2010/0213485 A1* | 8/2010 | McKenzie et al. | 257/98 |

OTHER PUBLICATIONS

Jayatissa, "Preparation of gallium-doped ZnO films . . . ", 2003, Semicond. Sci. Technol., vol. 18, pp. L27-L30.*

Charles, M.B., et al., "Growth of Uncracked $Al_{0.80}Ga_{0.20}N$/GaN DBR on Si(111)," Materials Research Society Symposium Proceedings, vol. 831, 2005, pp. E3.17.1-E3.17.5.

Xiong, C., et al., "The characteristics of GaN-based blue LED on Si substrate," Journal of Luminescence 122-123, 2007, pp. 185-187.

Lugo, J.E., et al., "Porous silicon multilayer structures: A photonic band gap analysis," Journal of Applied Physics, Apr. 15, 2002, pp. 4966-4972, vol. 91, No. 8, American Institute of Physics.

Zhang, B., et al., "Thin-film InGan multiple-quantum-well light-emitting diodes transferred from Si (111) substrate onto copper carrier by selective lift-off," Applied Physics Letters 86, 071113, 2005, American Institute of Physics.

Chan, S., et al., "Tunable, narrow, and directional luminescence from porous silicon light emitting devices," Applied Physics Letters, Jul. 12, 1999, pp. 274-276, vol. 75, No. 2, American Institute of Physics.

Vincent, G., "Optical properties of porous silicon superlattices," Applied Physics Letters, May 2, 1994, pp. 2367-2369, American Institute of Physics.

Taiwanese Patent Office, Office Action dated Jul. 30, 2012, Application No. 10120769520; 7 pages.

\* cited by examiner

LIGHT-EMITTING DIODE WITH NON-METALLIC REFLECTOR

This application claims the benefit of U.S. Provisional Application No. 61/089,779 filed on Aug. 18, 2008, entitled Light-Emitting Diode With Non-Metallic Reflector, which application is hereby incorporated herein by reference.

TECHNICAL FIELD

This invention relates generally to semiconductor devices and, more particularly, to crystalline group III-V light-emitting diodes.

BACKGROUND

Generally, light-emitting diode (LED) structures have a light-emitting layer interposed between a lower layer and an upper layer, wherein the upper layer and the lower layer have an opposite type of conductivity forming a p-n junction. The radiative recombination of electron-hole pairs in the depletion region of the p-n junction causes the emission of electromagnetic radiation (e.g., light). The electromagnetic radiation may be in the visible range or may be in a non-visible range. Different colors of LEDs may be created by using materials with different band gaps. Further, an LED with electromagnetic radiation emitting in a non-visible range may direct the non-visible light towards a phosphor lens or a like material type. When the non-visible light is absorbed by the phosphor, the phosphor emits a visible light.

The light-emitting layer typically emits light from both sides of the light-emitting layer. In practice, however, applications frequently only require light emitted from a single side, and because light is emitted from both sides, some light energy is lost. In an attempt to increase the amount of light emitted from a single side of the LED device, a reflective layer has been formed between the substrate and the LED structure. The reflective layer comprised a metal reflective material that acted to reflect light emitted from the LED structure on the substrate side back towards the light-emitting face of the LED device, thereby increasing the light efficiency of the LED device.

While the reflective metal layer is sufficient for some applications utilizing longer wavelengths, it has been found that the reflectivity of the metal layer is low for shorter wavelengths. As a result, the light efficiency of LED structures using a metal reflective layer is lower than desired. Accordingly, there is a need for an LED device having an increased light efficiency.

SUMMARY OF THE INVENTION

These and other problems are generally reduced, solved or circumvented, and technical advantages are generally achieved, by embodiments of the present invention, which provides LEDs having a non-metallic reflective layer.

In accordance with one aspect of the present invention, an LED device is provided. The LED device includes a substrate with a non-metallic reflective layer formed thereon. An LED structure is formed on the non-metallic reflective layer. The non-metallic reflective layer may include, for example, alternating layers of non-metallic materials having different refractive indices, alternating layers of high-porosity silicon and low-porosity silicon, or a reflective structure comprising silicon dioxide.

In accordance with another aspect of the present invention, an LED device is provided. The LED device includes a substrate and a reflective structure formed on a first side of the substrate. The reflective structure includes at least two different non-metallic materials having different refractive indices. An LED structure is formed on the reflective structure. The reflective structure may include, for example, alternating layers of non-metallic materials having different refractive indices, alternating layers of high-porosity silicon and low-porosity silicon, or a reflective structure comprising silicon dioxide.

In accordance with yet another aspect of the present invention, a method of forming an LED device is provided. The method includes providing a first substrate and forming a non-metallic reflective structure on the first substrate. An LED structure may be formed over the non-metallic reflective structure. The LED structure may be formed directly on the non-metallic reflective structure or formed on a second substrate. If the LED structure is formed on a second substrate, the LED structure may be bonded to the reflective structure and the second substrate may be removed.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming LEDs and the resulting structures is provided. The intermediate stages of manufacturing preferred embodiments of the present invention are illustrated. It should be understood that steps necessary to illustrate the inventive aspects of the invention are shown, but other processes may be performed. Throughout the various views and illustrative embodiments of the present invention, like reference numbers are used to designate like elements.

Figure 1:
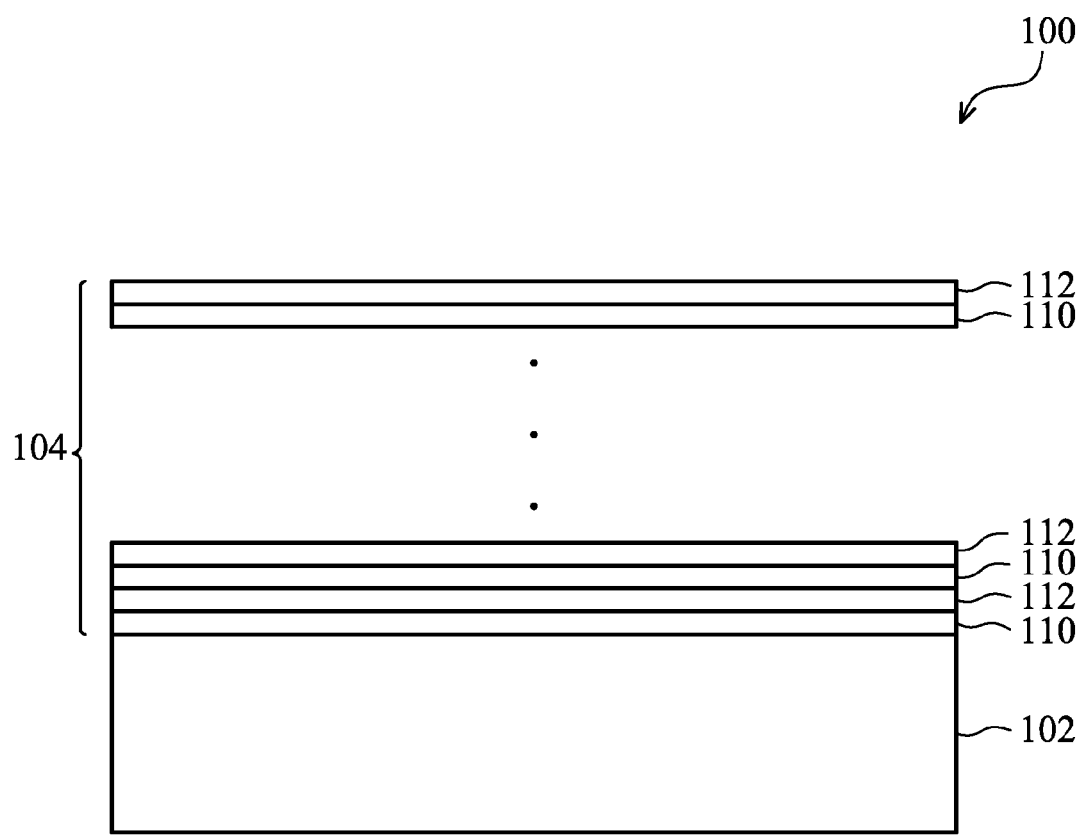
FIG. 1 illustrates in a cross-sectional view various intermediate processing steps of manufacturing a light-emitting diode device in accordance with an embodiment of the present invention.
Figure 2:
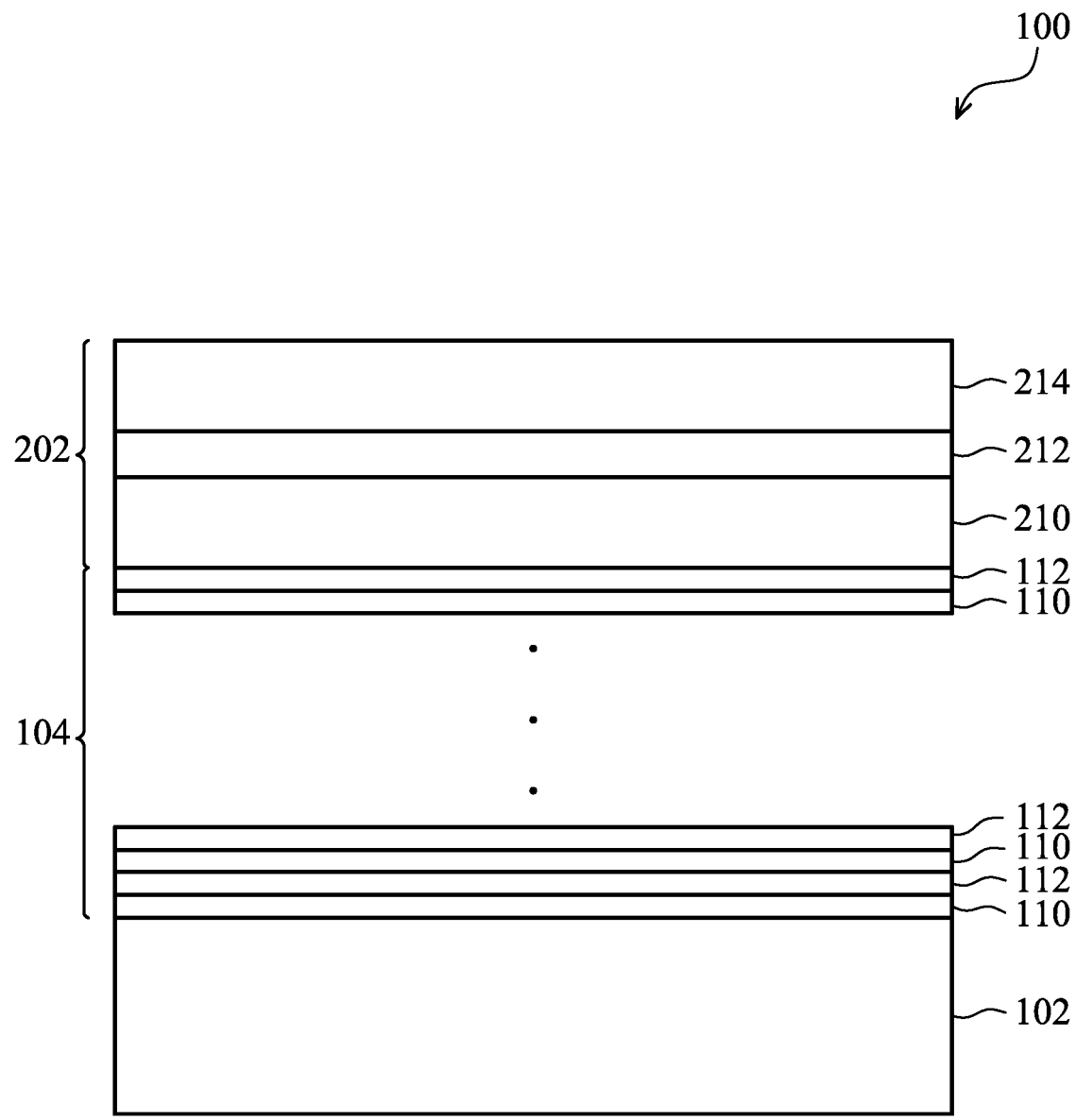
FIG. 2 illustrates in a cross-sectional view the processing steps of FIG. 1 following additional processing, in accordance with an embodiment of the present invention.

FIGS. 1 and 2 illustrate various intermediate process steps of forming a light-emitting diode (LED) device 100 with a non-metallic reflective layer in accordance with an embodiment of the present invention. Referring first to FIG. 1, the LED device 100 is shown having a substrate 102 and a non-metallic reflective layer 104 formed thereon. The substrate 102 is preferably a bulk semiconductor substrate, doped or undoped, preferably having a (111) surface orientation. It should be noted that while embodiments of the present invention are described in the context of using a bulk silicon substrate, other substrates may be used. For example, silicon-on-insulator (SOI) substrates, sapphire substrates, SiC substrates, and the like may also be used. Furthermore, while a substrate having a (111) surface orientation is preferred, substrates having a different surface orientation, such as (100) and (110) surface orientations, may also be used.

The non-metallic reflective layer 104 comprises pairs of layers of non-metallic materials having different refractive indices arranged in an alternating manner. For example, FIG. 1 illustrates a first non-metallic layer 110 formed over the substrate 102, and a second non-metallic layer 112 formed over the first non-metallic layer 110, wherein the first non-metallic layer 110 and the second non-metallic layer 112 are formed of different materials having different refractive indices. Preferably, the non-metallic reflective layer 104 includes at least three pairs of the first non-metallic layer 110 and the second non-metallic layer 112, but more preferably about 5 to about 20 pairs.

The preferred thickness of each layer is dependent upon the wavelength of light that is to be reflected and the refractive index of the material. In an embodiment, the thickness of the layers is such that the following equality is true.

$$n_1 d_1 = n_2 d_2 = \lambda/4$$

Wherein
$n_1$ is the refractive index of the first non-metallic layer 110;
$d_1$ is the thickness of the first non-metallic layer 110;
$n_2$ is the refractive index of the second non-metallic layer 112;
$d_2$ is the thickness of the second non-metallic layer 112; and
$\lambda$ is the wavelength of the light to be reflected.

In an embodiment, alternating layers of the first non-metallic layer 110 and the second non-metallic layer 112 comprise alternating layers of Si and SiC. The Si layer has a refractive index of about 4.1, while the SiC layer has a refractive index of about 2.7 for the 460 nm-480 nm wavelength light. These alternating layers of a high-refractive index material and a low-refractive index material provides a highly reflective structure for the non-metallic reflective layer 104. The Si layer and SiC layer may be formed by any suitable method, including an epitaxial process such as a molecular-beam epitaxy (MBE), chemical vapor deposition (CVD), hydride vapor phase epitaxy (HVPE), liquid phase epitaxy (LPE), or the like.

Optionally, first non-metallic layer 110 and the second non-metallic layer 112 may be doped, thereby providing a conductive non-metallic reflective layer. A conductive non-metallic reflective layer may be desirable in situations in which a vertical LED device is being fabricated in which the electrical contact to the bottom layers of the LED structure is formed along the bottom of the substrate 102. In the embodiment in which the first non-metallic layer 110 and the second non-metallic layer 112 comprise alternating layers of Si and SiC, and assuming a p-up LED structure, the Si layer may be doped with an n-type dopant, such as phosphorous or arsenic, by implant or in situ to a concentration of about 1e16 to about 1e21 atoms/cm$^3$, and the SiC may be doped with an n-type dopant, such as phosphorous or arsenic, by implant or in situ to a concentration of about 1e16 to about 1e21 atoms/cm$^3$.

As another example, the first non-metallic layer 110 and the second non-metallic layer 112 may be formed of alternating layers of Si and Si$_x$Ge$_{1-x}$, wherein x is greater than about 0.5. In this embodiment, the Si has a refractive index of about 4.1, while the Si$_x$Ge$_{1-x}$ layer has a refractive index of about 4.2 for light having a wavelength of about 460 nm to about 480 nm. In this embodiment, the Si layer and the Si$_x$Ge$_{1-x}$ layer may be formed by any suitable method, including an epitaxial growth process such as MBE, CVD, HVPE, LPE, or the like. Assuming a p-up LED structure, the Si layer may be doped by implant or in situ with an n-type dopant, such as phosphorous or arsenic, to a concentration of about 1e16 to about 1e21 atoms/cm$^3$, and the Si$_x$Ge$_{1-x}$ layer may be doped by implant or in situ with an n-type dopant by implant or in situ to a concentration of about 1e16 to about 1e21 atoms/cm$^3$.

As another example, the first non-metallic layer 110 and the second non-metallic layer 112 may be formed of alternating layers of Si (Si$_x$Ge$_{1-x}$) and Si$_x$C$_{1-x}$, wherein x is greater than about 0.95. In this embodiment, the Si has a refractive index of about 4.1, while the Si$_x$C$_{1-x}$ layer has a refractive index of slightly less than that of Si for light having a wavelength of about 460 nm to about 480 nm. In this embodiment, the Si(Si$_x$Ge$_{1-x}$) layer and the Si$_x$C$_{1-x}$ may be formed by any suitable method, including an epitaxial growth process such as MBE, CVD, HVPE, LPE, or the like. Assuming a p-up LED structure, the Si(Si$_x$Ge$_{1-x}$) layer may be doped by implant or in situ with an n-type dopant, such as phosphorous or arsenic, to a concentration of about 1e16 to about 1e21 atoms/cm$^3$, and the Si$_x$C$_{1-x}$ layer may be doped by implant or in situ with an n-type dopant by implant or in situ to a concentration of about 1e16 to about 1e21 atoms/cm$^3$.

As yet another example, the first non-metallic layer 110 and the second non-metallic layer 112 may be formed of alternating layers of SiC and GaN, wherein x is greater than about 0.95. In this embodiment, the SiC has a refractive index of about 2.7, while the GaN layer has a refractive index of about 2.4-2.5 for light having a wavelength of about 460 nm to about 480 nm. In this embodiment, the Si$_x$C$_{1-x}$ layer may be formed by an epitaxial growth process and doped by implant or in situ with an n-type dopant by implant or in situ to a concentration of about 1e16 to about 1e21 atoms/cm$^3$. The GaN layer may be formed by an epitaxial growth process and doped by implant or in situ with an n-type dopant by implant or in situ to a concentration of about 1e16 to about 1e21 atoms/cm$^3$.

Referring now to FIG. 2, the LED device 100 is shown after an LED structure 202 has been formed over the non-metallic reflective layer 104. The LED structure 202 may comprise any LED structure suitable for a particular application. Generally, the LED structure 202 includes a lower LED layer 210 formed over the surface of the substrate 102. Preferably, the lower LED layer 210 is formed of a group III-V compound doped with a dopant of the first conductivity type. For example, a group III-N compound having an n-type conductivity such as n-GaN may be used. The lower LED layer 210 of n-GaN may be formed by, for example, a selective epitaxial growth process such as MBE, metal organic CVD (MOCVD), HVPE, LPE, or the like. Other group III-N materials that may be used include, for example, GaN, InN, AlN, In$_x$Ga$_{(1-x)}$N, Al$_x$Ga$_{(1-x)}$N, Al$_x$In$_y$Ga$_{(1-x-y)}$N, or the like. Other group III-V materials may also be used.

The light-emitting layer 212 (also sometimes referred to as an active layer) is formed on the lower LED layer 210. The light-emitting layer 212 may include a homojunction, heterojunction, single-quantum well (SQW), multiple-quantum well (MQW), or the like structure. In an exemplary embodiment, the light-emitting layer 212 comprises undoped n-type gallium indium nitride ($Ga_xIn_yN_{(1-x-y)}$). In alternative embodiments, the light-emitting layer 212 includes other commonly used materials such as $Al_xIn_yGa_{(1-x-y)}N$. In yet other embodiments, the light-emitting layer 212 may be a multiple quantum well including multiple well layers (such as InGaN) and barrier layers (such as GaN) allocated in an alternating pattern. Again, the formation methods include MOCVD, MBE, HVPE, LPE, or other applicable CVD methods.

An upper LED layer 214 is disposed on the light-emitting layer 212. The upper LED layer 214 is preferably formed of a group III-N compound doped with a dopant of the second conductivity type, opposite of the first conductivity type, such as p-GaN, and may be formed by a process similar to the lower LED layer 210.

It should be noted that the above description provides a general overview of the construction of an LED structure for illustrative purposes. Other layers, such as buffer/nucleation layers, cladding/contact layers, or the like may also be present as required and/or desired for a particular application. Furthermore, it should be noted that where a layer was described as a single layer, a plurality of layers may be used comprising the same or different materials. For example, the lower and upper LED layers may each comprise one or more contact layers and one or more cladding layers, which may both be formed of the same or different materials. The structure of the LED structure may also vary depending on the type of materials used and the intended application. It is expected that the many types of LED structures may be used with embodiments of the present invention, which provides a non-metallic reflective layer.

It should also be noted that the above process assumes a p-up LED structure. In this embodiment, the lower LED layer 210 is doped to an n-type conductivity. As a result, in embodiments in which the non-metallic reflective layer 104 is conductive, the non-metallic reflective layer 104 is doped to have an n-type conductivity. Other embodiments of the present invention in which an n-up LED structure is utilized, the lower LED layer 210, the non-metallic reflective layer 104, and/or the substrate 102 may be doped to have a p-type conductivity, and the upper LED layer 214 is doped to have an n-type conductivity.

It should be appreciated that embodiments incorporating the features of the embodiment discussed above utilize a non-metallic reflective layer. It has been found that utilizing non-metallic reflective layers reduces the amount of light absorbed by the absorbing substrate, thereby increasing the light efficiency of the LED device. The use of materials such as those discussed herein also provides for improved reflectivity for shorter wavelengths, particularly for wavelengths less than about 500 nm.

Figure 3:
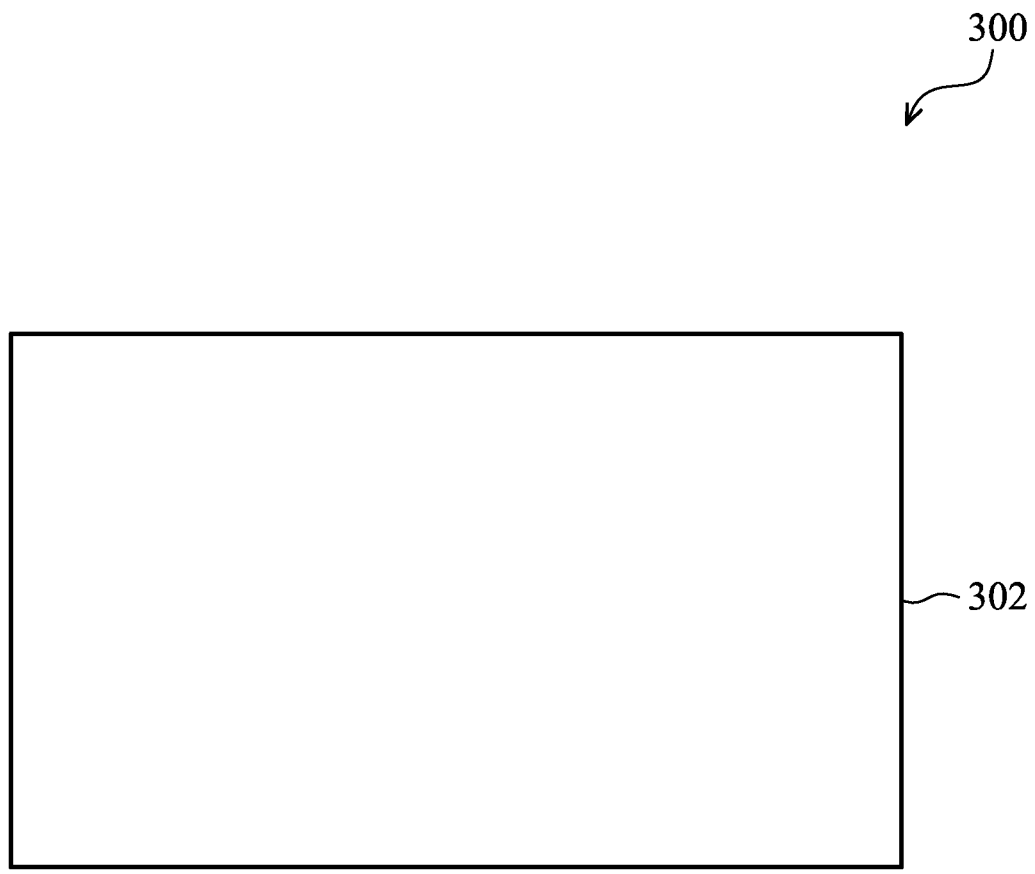
FIG. 3 illustrates in a cross-sectional view a substrate for use with embodiments of the present invention.
Figure 4:
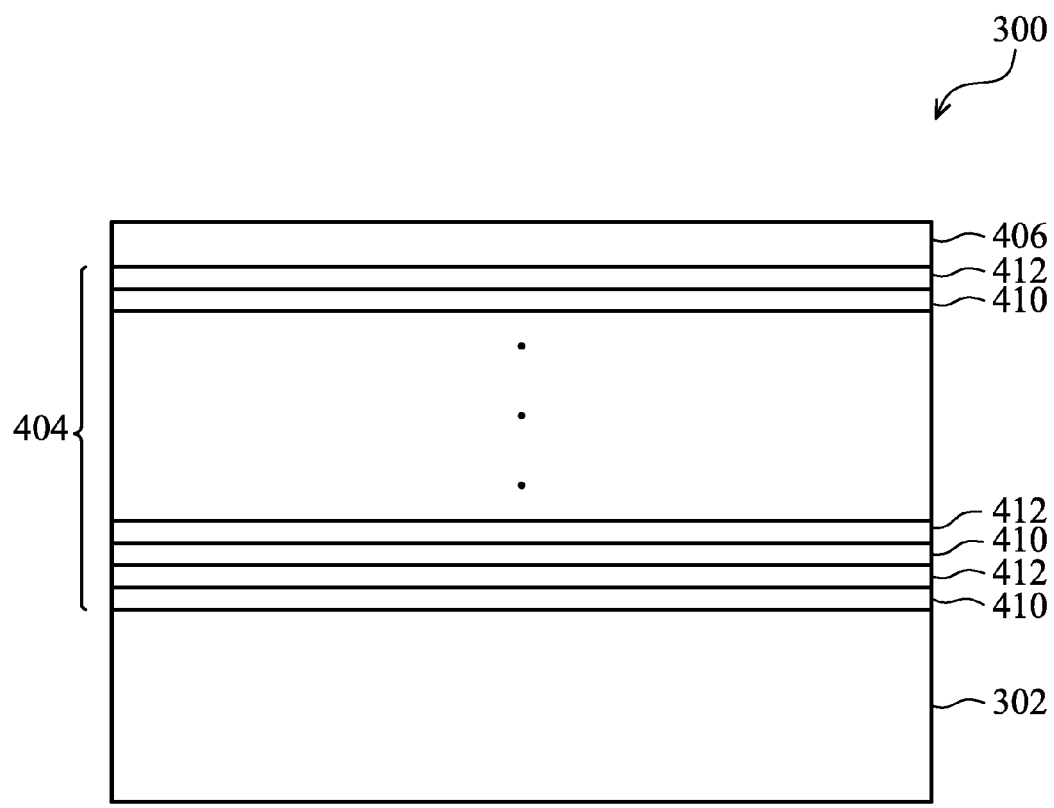
FIG. 4 illustrates in a cross-sectional view an intermediate structure obtained from the substrate of FIG. 3 following additional processing steps in accordance with an embodiment of the present invention.
Figure 5:
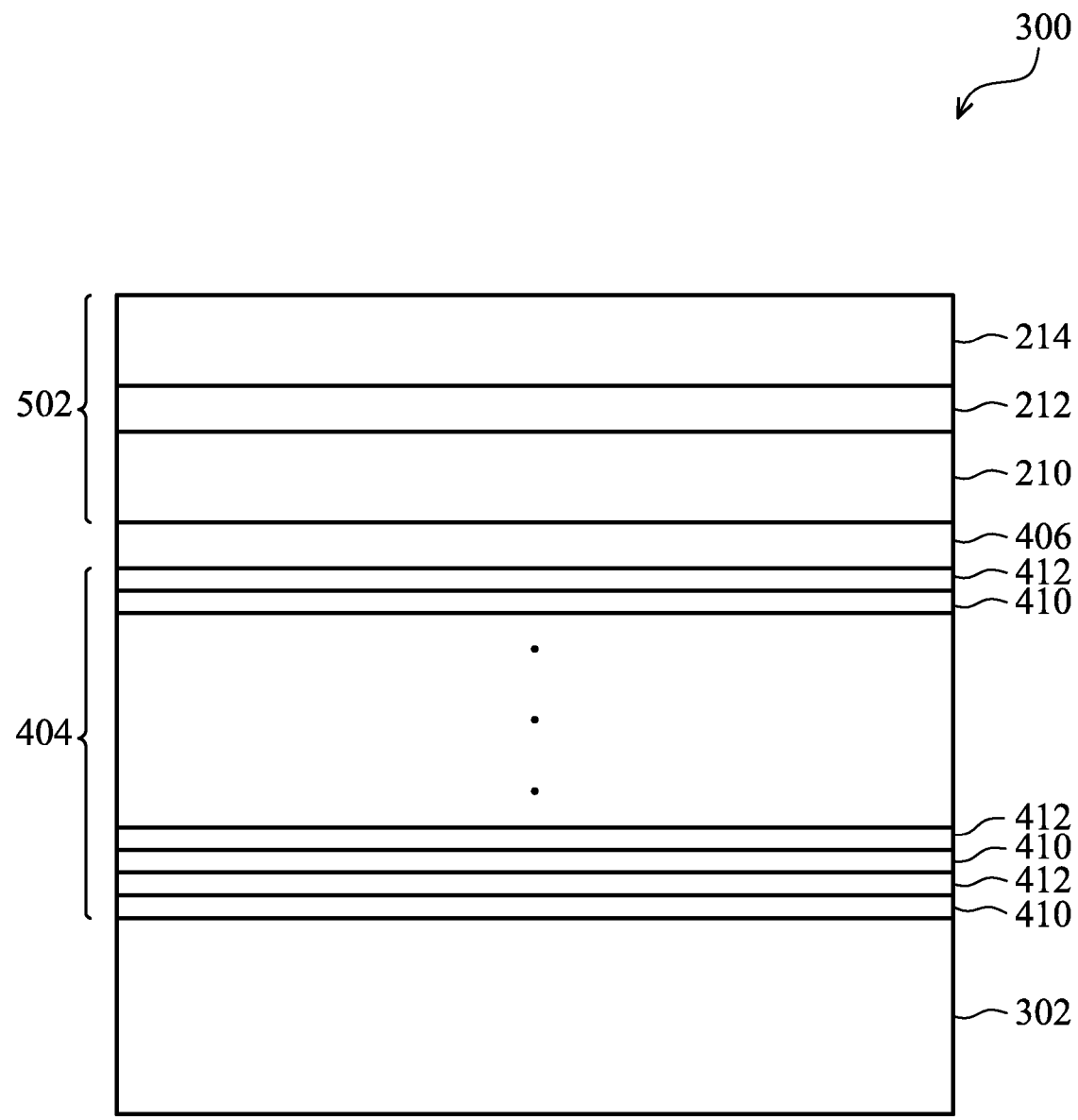
FIG. 5 illustrates in a cross-sectional view an intermediate structure obtained from the structure of FIG. 4 following additional processing steps in accordance with an embodiment of the present invention.

FIGS. 3-5 illustrate various intermediate process steps of forming a LED device 300 with a non-metallic reflective layer in accordance with another embodiment of the present invention. In this embodiment, a substrate 302, which may be similar to substrate 102 discussed above with reference to FIG. 1, has an initial thickness at least as great as a final desired thickness of the substrate plus a thickness of a non-metallic reflective layer. In embodiments in which a conductive substrate is desired, such as a vertical LED device, the substrate may be doped.

As illustrated in FIG. 4, a non-metallic reflective layer 404 is formed of alternating layers of high-porosity silicon layers 410 and low-porosity silicon layers 412. The alternating layers of low-porosity silicon and high-porosity silicon may be formed by, for example, an electro-chemical anodization process using an electrolyte composition of aqueous solution of hydrofluoric acid (about 20% by mass) and ethylic alcohol with an anodic current density alternating between about 1 $mA/cm^2$ to about 200 $mA/cm^2$. This process results in alternating layers of silicon having a porosity of about 30% porosity and about 95% porosity.

The layers of silicon having a porosity of about 30% have a refractive index of about 2.69, and the layers of silicon having a porosity of about 95% have a refractive index of about 1.06 for light having a wavelength of about 460 nm to about 480 nm. As discussed above, the alternating layers of a high-refractive index material and a low-refractive index material cause light striking the interface between the alternating layers to be reflected.

FIG. 4 also illustrates an optional step of forming a seed layer 406 over the non-metallic reflective layer 404 in accordance with an embodiment of the present invention. The seed layer 406 may provide a better surface and a seed layer upon which an LED structure may be epitaxially formed in subsequent processing steps. The seed layer 406 is preferably formed using an epitaxial growth of silicon (Si), though other compounds, such as silicon germanium (SiGe), silicon carbon (SiC), or the like, may also be used.

In an embodiment, a seed layer 406 of silicon is formed using an CVD process using an ambient of $H_2$ at a temperature of about 600° C. to about 1100° C. and a pressure of about 1 torr to about 760 torr. If used, the seed layer 406 preferably has a thickness of less than about one-fourth of the wavelength of the light to be reflected times the refractive index of the seed layer 406. Because silicon may absorb some light, it is preferred that the silicon seed layer 406 be kept to a minimum thickness required to adequately perform an epitaxial growth process to form the LED structure in subsequent processing steps. Other processes, such as a remote plasma-enhanced chemical vapor deposition (RPCVD), MBE, MOVPE, HVPE, LPE, or the like, may also be used Thereafter, as illustrated in FIG. 5, an LED structure 502 may be formed. The LED structure 502 may have similar layers as the LED structure 202, wherein like reference numerals refer to like elements.

Figure 6:
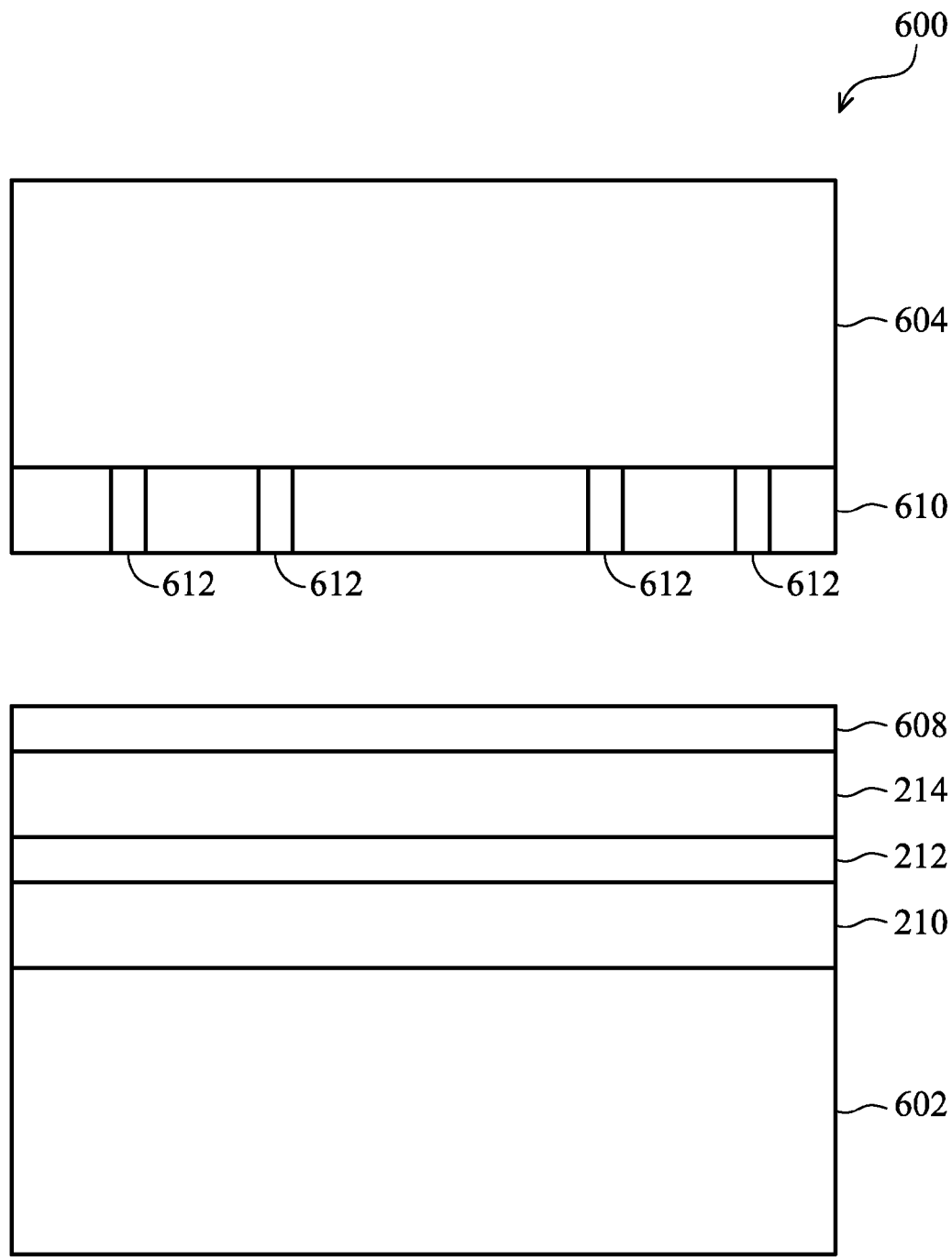
FIG. 6 illustrates in a cross-sectional view an intermediate structure in accordance with another embodiment of the present invention.
Figure 7:
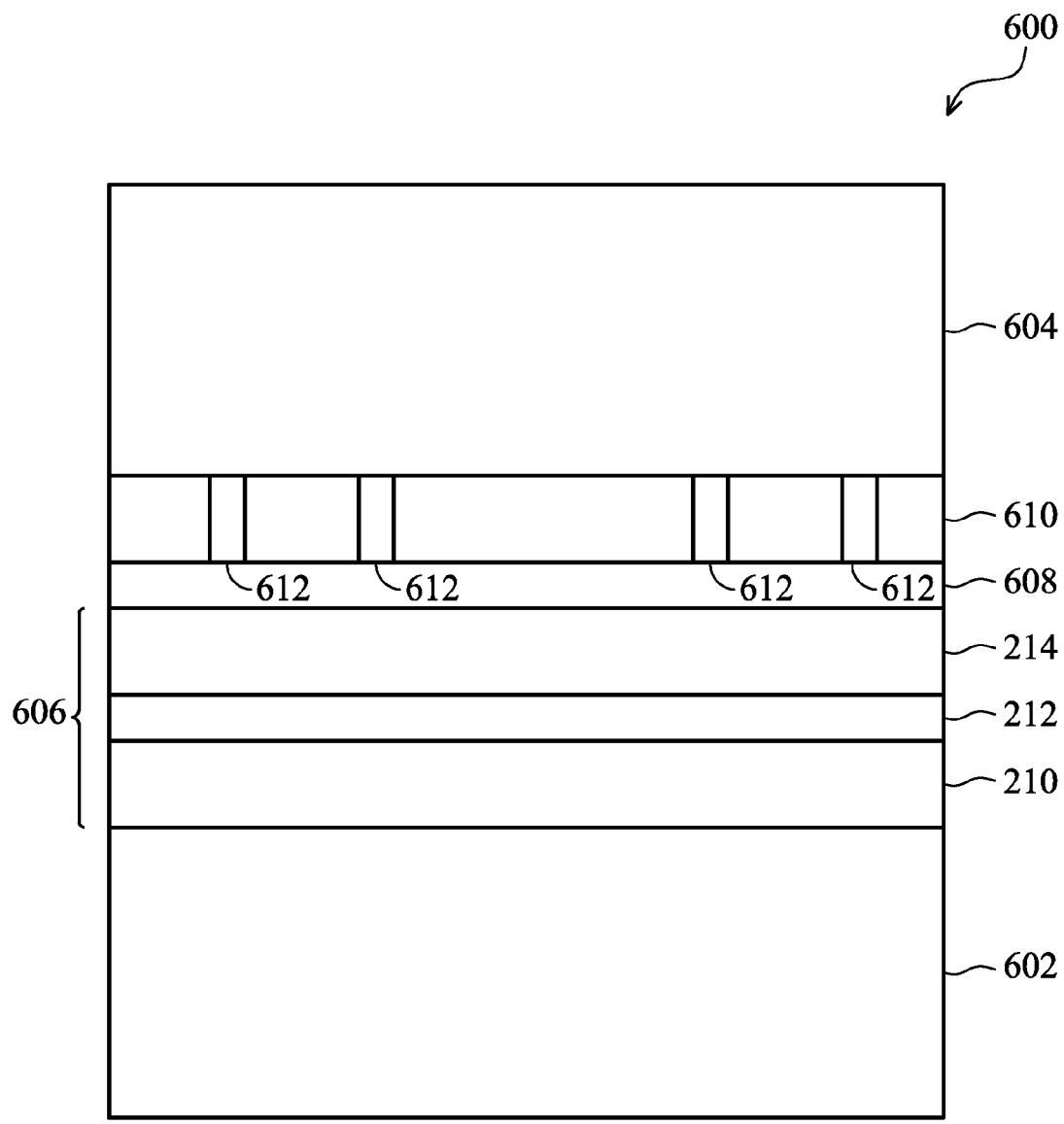
FIG. 7 illustrates in a cross-sectional view an intermediate structure obtained from the structure of FIG. 6 following additional processing steps in accordance with an embodiment of the present invention.

FIGS. 6 and 7 illustrate various intermediate process steps of forming an LED device 600 in accordance with yet another embodiment of the present invention. As discussed above, the non-metallic reflective layers, such as the non-metallic reflective layers 104 and 404, comprise many pairs of layers, most preferably more than 10 pairs of layers. The number of pairs of layers may be reduced by using alternating layers of materials with a greater refractive index difference, such as silicon/silicon dioxide($SiO_2$), $SiO_2/HfO_2$, or $SiO_2/TiO_2$. For light in the 460 nm-480 nm wavelength, silicon has a refractive index of about 4 and silicon dioxide, $HfO_2$, and $TiO2$ have a refractive index of about 1.46, 1.94, and 3.0, respectively. This greater difference in refractive indices allows the number of pairs of layers to be reduced, preferably to about 4 pairs of layers. However, because of the difficulty of epitaxially growing the LED structure over a layer of non-epitaxial layers, it is preferred that the non-metallic reflective layer comprising non-epitaxial layers be formed separately from the LED structure as described in greater detail below.

Referring first to FIG. 6, a first substrate 602 is shown having an LED structure 606 formed thereon. The LED structure 606 may be any suitable LED structure, such as LED structure 202, wherein like reference numerals refer to like elements. FIG. 6 also shows an optional metal layer 608. The optional metal layer 608 preferably has a conductivity type the same as the upper layer of the LED structure 606. For example, in an embodiment in which the upper LED layer 214 has a p-type conductivity, the optional metal layer 608 is preferably formed of a p-type metal such as Ni/Au, ITO, or the like, and in an embodiment in which the upper LED layer 214 has an n-type conductivity, the optional metal layer 608 is preferably formed of an n-type metal such as Ti/Au, Ti/Al, or the like.

A second substrate 604 has a non-metallic reflector 610 formed thereon, preferably using materials having a high difference in refractive indices, such as silicon and silicon dioxide. The non-metallic reflector 610 may be any suitable reflective structure, such as a distributed Bragg reflector (DBR), an omni-directional reflector (ODR), or the like. Suitable non-metallic reflectors include structures such as those discussed above with reference to FIGS. 1-5 and alternating layers of silicon and silicon dioxide.

The second substrate 604 is preferably a thermally conductive substrate, such as a silicon substrate, a metallic substrate, a ceramic substrate, or the like. It should also be noted that in some embodiments, it may be desirable to have thermal vias 612 extending through the non-metallic reflector 610. In some embodiments, particularly those utilizing silicon dioxide that has low thermal conductivity properties, the thermal vias 612 provide a mechanism to transfer heat away from the LED structure 606 once the substrates are joined in subsequent processing steps. The thermal vias 612 may be formed using photolithography techniques known in the art.

FIG. 7 illustrates the bonding of the second substrate 604 to the LED structure 606 in accordance with an embodiment of the present invention. The second substrate 604 may be bonded to the LED structure 606 with a thermally conductive material, such as Au, Ni, Cu, or the like.

Figure 8:
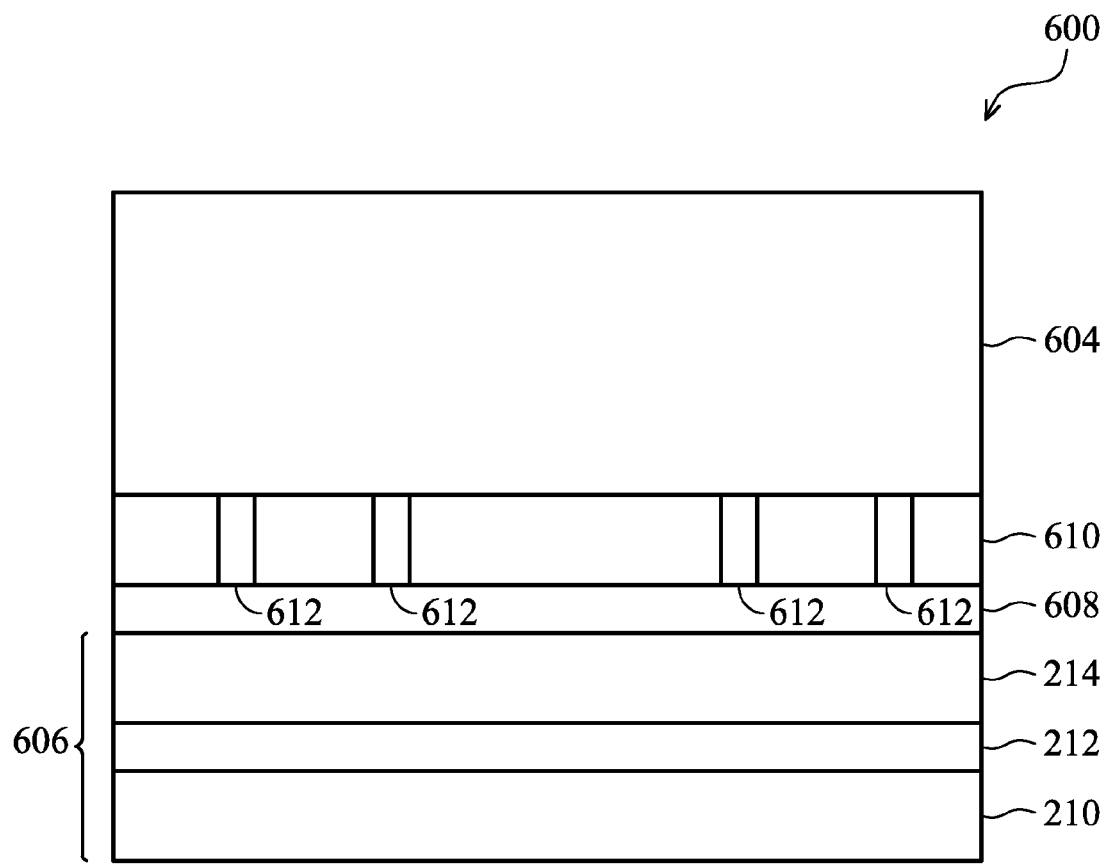
FIG. 8 illustrates in a cross-sectional view an intermediate structure obtained from the structure of FIG. 7 following additional processing steps in accordance with an embodiment of the present invention.

Thereafter, as illustrated in FIG. 8, the first substrate 602 (see FIG. 7) may be separated from the LED structure 606 and the now attached second substrate 604. The first substrate 602 preferably has a layer of a different material, such as a buried oxide (BOX) layer or a porous layer. The substrate 602 may be etched or separated from the LED structure 606 by utilizing a mechanical detach process, such as a water jet process, or a chemical etch process. The different material allows a mechanical and/or chemical process to be used to separate the first substrate 602.

Thereafter, processes may be performed to complete the LED device. For example, electrical contacts (front-side and/or back-side contacts) may be formed to the first and second contact layers, respectively, passivation layers may be formed, and the LED device may be diced and packaged.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting diode (LED) device comprising: a substrate; a non-metallic reflective layer over a surface of the substrate, the non-metallic reflective layer being conductive and comprising alternating layers of $Si_xGe_{1-x}$ and $Si_xC_{1-x}$; a plurality of thermally-conductive vias extending through the non-metallic reflective layer; a metal layer disposed over the non-metallic reflective layer; and an LED structure disposed over the metal layer, the LED structure being coupled to the non-metallic reflective layer through the metal layer.

2. The LED device of claim 1, wherein the non-metallic reflective layer comprises alternating layers of a first material and a second material, each of the first material and the second material being a non-metallic material.

3. The LED device of claim 1, wherein the metal layer has a conductivity type the same as an upper layer of the LED structure.

4. The LED device of claim 1, wherein the non-metallic reflective layer comprises silicon dioxide.

5. The LED device of claim 1, wherein the non-metallic reflective layer comprises an omni-directional reflector.

6. A light-emitting diode (LED) device comprising:
a substrate;
a reflective structure on a first side of the substrate, the reflective structure comprising at least a first material and a second material, the first material and the second material having different refractive indices and being non-metallic, wherein the reflective structure comprises alternating layers of about 95% porosity silicon and about 30% porosity silicon;
a metal layer disposed over the reflective structure; and
an LED structure formed over the metal layer;
wherein:
the LED structure includes an active layer disposed between a first semiconductor layer and a second semiconductor layer, the first and second semiconductor layers having different types of conductivity; and
the reflective structure is configured to have a same type of conductivity as one of the first and second semiconductor layers disposed closer to the reflective structure.

7. The LED device of claim 6, wherein the LED device is a vertical LED device.

8. The LED device of claim 6, further comprising thermal vias extending through the reflective structure.

9. The LED device of claim 6, wherein the reflective structure comprises silicon dioxide.

10. A method of forming a light-emitting diode (LED), the method comprising:
forming a reflective structure on a first substrate, the reflective structure being a conductive, non-metallic structure;
forming an LED structure on a second substrate;
forming a metal layer over the LED structure;
bonding the metal layer to the reflective structure using a thermally conductive material other than an oxide; and
removing the second substrate.

11. The method of claim 10, wherein the reflective structure comprises silicon dioxide.

12. The method of claim 10, wherein the forming the reflective structure comprises forming alternating layers of a first non-metallic layer and a second non-metallic layer.

13. The method of claim 10, wherein the forming the reflective structure comprises forming alternating layers of a high-porosity silicon and a low-porosity silicon.

14. The method of claim 10, wherein the reflective structure comprises an omni-directional reflector.

15. The method of claim 10, wherein the reflective structure comprises alternating layers of Si and $Si_xGe_{1-x}$, Si and $Si_xGe_{1-x}$, and $Si_xC_{1-x}$, or SiC and GaN.

16. The method of claim 10, wherein the thermally conductive material comprises Au, Ni, or Cu.

* * * * *